US010365562B2

(12) United States Patent
Ongayi et al.

(10) Patent No.: US 10,365,562 B2
(45) Date of Patent: *Jul. 30, 2019

(54) COATING COMPOSITIONS FOR USE WITH AN OVERCOATED PHOTORESIST

(75) Inventors: Owendi Ongayi, Marlborough, MA (US); Vipul Jain, Westborough, MA (US); Suzanne Coley, Mansfield, MA (US); Anthony Zampini, Westborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/340,989

(22) Filed: Dec. 30, 2011

(65) Prior Publication Data

US 2013/0004901 A1   Jan. 3, 2013

Related U.S. Application Data

(60) Provisional application No. 61/428,896, filed on Dec. 31, 2010.

(51) Int. Cl.
*G03F 7/09* (2006.01)
*G03F 7/11* (2006.01)
*G03F 7/16* (2006.01)

(52) U.S. Cl.
CPC .............. *G03F 7/09* (2013.01); *G03F 7/091* (2013.01); *G03F 7/092* (2013.01); *G03F 7/094* (2013.01); *G03F 7/11* (2013.01); *G03F 7/16* (2013.01); *Y10T 428/31786* (2015.04)

(58) Field of Classification Search
USPC ...................................................... 430/271.1
See application file for complete search history.

(56) References Cited

U.S. PATENT DOCUMENTS

| 6,277,750 | B1 * | 8/2001 | Pawlowski et al. ........... 438/689 |
| 6,852,421 | B2 * | 2/2005 | Wayton et al. ................ 428/480 |
| 2008/0038678 | A1 | 2/2008 | Kishioka et al. |
| 2008/0107997 | A1 * | 5/2008 | Hiroi et al. .................... 430/311 |
| 2008/0118870 | A1 * | 5/2008 | Enomoto et al. .............. 430/319 |
| 2009/0087799 | A1 | 4/2009 | Tachibana et al. |
| 2010/0009297 | A1 * | 1/2010 | Yao ..................... C08G 73/0273 430/325 |
| 2011/0230058 | A1 | 9/2011 | Sakamoto et al. |

FOREIGN PATENT DOCUMENTS

| EP | 1046958 A1 | 10/2000 |
| EP | 1757985 A1 | 2/2007 |
| EP | 1811342 A1 | 7/2007 |
| KR | 1020070002019 | 3/2009 |

OTHER PUBLICATIONS

English Translation of Notice of Fifth Office Action for Chinese Application No. 201110463317.5—dated Oct. 19, 2015.
English Translation of Notification of Reasons for Refusal for Japanese Application No. 2012-00026—dated Sep. 17, 2015.
English Translation of Examination Report for Taiwan Application No. 100149508—dated Nov. 7, 2013.
English language summary of Office Action dated Aug. 25, 2017 issued in counterpart Korean Application No. 10-2012-0000147.

* cited by examiner

*Primary Examiner* — Cynthia H Kelly
*Assistant Examiner* — Anna Malloy
(74) *Attorney, Agent, or Firm* — Mintz Levin Cohn Ferris Glovsky and Popeo, P.C.; Peter F. Corless

(57) ABSTRACT

Organic coating compositions, particularly antireflective coating compositions, are provided that comprise that comprise a component that comprises one or more uracil moieties. Preferred compositions of the invention are useful to reduce reflection of exposing radiation from a substrate back into an overcoated photoresist layer and/or function as a planarizing, conformal or via-fill layer.

22 Claims, No Drawings

COATING COMPOSITIONS FOR USE WITH AN OVERCOATED PHOTORESIST

This application claims the benefit of priority under 35 U.S.C. § 119(e) to U.S. Provisional Application No. 61/428,896, filed Dec. 31, 2011, the entire contents of which application are incorporated herein by reference.

The present invention relates to uracil compositions that are particularly useful as a component of a coating composition underlying an overcoated photoresist.

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced or chemical transformation of the photoresist coating to thereby transfer the pattern of the photomask to the photoresist-coated substrate. Following exposure, the photoresist is developed to provide a relief image that permits selective processing of a substrate.

A major use of photoresists is in semiconductor manufacture where an object is to convert a highly polished semiconductor slice, such as silicon or gallium arsenide, into a complex matrix of electron conducting paths that perform circuit functions. Proper photoresist processing is a key to attaining this object. While there is a strong interdependency among the various photoresist processing steps, exposure is believed to be one of the most important steps in attaining high resolution photoresist images.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non-intended, again resulting in linewidth variations.

One approach used to reduce the problem of reflected radiation has been the use of a radiation absorbing layer interposed between the substrate surface and the photoresist coating layer. See U.S. 2007026458 and 2010029556.

Electronic device manufacturers continually seek increased resolution of a photoresist image patterned over antireflective coating layers.

In one aspect, we provide new uracil-type monomers that are useful to form resins of distinct underlying antireflective coating compositions.

In a further aspect, resins are provided that comprise a reacted uracil-type monomer as disclosed herein.

Preferred resins of the coating compositions of the invention may comprise one or more polyester linkages. Preferred resins also may comprise groups in addition to uracil groups such as cyanurate groups.

In a yet further aspect, antireflective compositions are provided that comprises a resin as disclosed herein. Preferred additional components of an underlying antireflective coating composition include a crosslinking functionality or material. Preferred underlying coating compositions are formulated as organic solvent compositions for spin-on application to a desired substrate such as a microelectronic wafer.

Preferred underlying coating compositions of the invention are crosslinked prior to treatment to modulate water contact angle. Such crosslinking includes hardening and covalent-bonding forming reactions between one or more composition components.

For antireflective applications, underlying compositions of the invention also preferably contain a component that comprises chromophore groups that can absorb undesired radiation used to expose the overcoated resist layer from reflecting back into the resist layer. Such chromophore groups may be present with other composition components such as the resin(s) or an acid generator compound, or the composition may comprise another component that may comprise such chromophore units, e.g. a small molecule (e.g. MW less than about 1000 or 500) that contains one or more chromophore moieties, such as one or more optionally substituted phenyl, optionally substituted anthracene or optionally substituted naphthyl groups.

Generally preferred chromophores for inclusion in coating composition of the invention particularly those used for antireflective applications include both single ring and multiple ring aromatic groups such as optionally substituted phenyl, optionally substituted naphthyl, optionally substituted anthracenyl, optionally substituted phenanthracenyl, optionally substituted quinolinyl, and the like. Particularly preferred chromophores may vary with the radiation employed to expose an overcoated resist layer. More specifically, for exposure of an overcoated resist at 248 nm, optionally substituted anthracene and optionally substituted naphthyl are preferred chromophores of the antireflective composition. For exposure of an overcoated resist at 193 nm, optionally substituted phenyl and optionally substituted naphthyl are particularly preferred chromophores of the antireflective composition. Preferably, such chromophore groups are linked (e.g. pendant groups) to a resin component of the antireflective composition.

As discussed above, coating compositions of the invention preferably are crosslinking compositions and contain a material that will crosslink or otherwise cure upon e.g. thermal or activating radiation treatment. Typically, the composition will contain a crosslinker component, e.g. an amine-containing material such as a melamine, glycouril or benzoguanamine compound or resin. Preferably, crosslinking compositions of the invention can be cured through thermal treatment of the composition coating layer. Suitably, the coating composition also contains an acid or more preferably an acid generator compound, particularly a thermal acid generator compound, to facilitate the crosslinking reaction.

For use as an antireflective coating composition, as well as other applications such as via-fill, preferably the composition is crosslinked prior to applying a photoresist composition layer over the composition layer.

A variety of photoresists may be used in combination (i.e. overcoated) with a coating composition of the invention. Preferred photoresists for use with the antireflective compositions of the invention are chemically-amplified resists, especially positive-acting photoresists that contain one or more photoacid generator compounds and a resin component that contains units that undergo a deblocking or cleavage reaction in the presence of photogenerated acid, such as photoacid-labile ester, acetal, ketal or ether units. Negative-acting photoresists also can be employed with coating compositions of the invention, such as resists that crosslink (i.e. cure or harden) upon exposure to activating radiation. Preferred photoresists for use with a coating composition of the invention may be imaged with relatively short-wavelength radiation, e.g. radiation having a wavelength of less than 300 nm or less than 260 nm such as 248 nm, or radiation having a wavelength of less than about 200 nm such as 193 nm EUV and other high energy imaging also will be suitable.

The invention further provides methods for forming a photoresist relief image and novel articles of manufacture comprising substrates (such as a microelectronic wafer substrate) coated with a coating composition of the invention alone or in combination with a photoresist composition.

Other aspects of the invention are disclosed infra.

We now provide new organic coating compositions that are particularly useful with an overcoated photoresist layer. Preferred coating compositions of the invention may be applied by spin-coating (spin-on compositions) and formulated as a solvent composition. The coating compositions of the invention are especially useful as antireflective compositions for an overcoated photoresist and/or as planarizing or via-fill compositions for an overcoated photoresist composition coating layer.

As discussed above, uracil-type compounds are provided. Preferred uracil components include those that comprise groups of the following Formula (I):

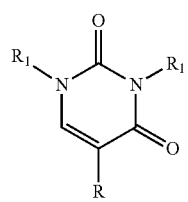

wherein R is a hydrogen or non-hydrogen substituent such as halogen (F, Cl, Br, or I, particularly F), nitro, optionally substituted alkyl (e.g. optionally substituted $C_{1-10}$ alkyl), optionally substituted alkenyl or alkynyl preferably having 2 to about 10 carbon atoms such as such as allyl, optionally substituted alkanoyl preferably having 1 to about 10 carbon atoms; optionally substituted alkoxy (including epoxy) preferably having 1 to about 10 carbon atoms such as methoxy, propoxy, butoxy; optionally substituted alkylthio preferably having 1 to about 10 carbon atoms; optionally substituted alkylsulfinyl preferably 1 to about 10 carbon atoms; optionally substituted alkylsulfonyl preferably having 1 to about 10 carbon atoms; optionally substituted carboxy preferably have 1 to about 10 carbon atoms (which includes groups such as —COOR' where R' is H or $C_{1-8}$alkyl, including esters that are substantially non-reactive with photoacid); optionally substituted alkaryl such as optionally substituted benzyl, optionally substituted carbocyclic aryl such as optionally substituted phenyl, naphthyl, acenaphthyl, or optionally substituted heteralicyclic or heteroaromatic group such as methylphthalimide, N-methyl-1,8-phthalimide; and each R1 is the same or different and may represent a hydrogen, chemical bond (e.g. where the uracil moiety is linked as a member of a resin chain), or a non-hydrogen substituent such as specified above for R.

In a preferred aspect, uracil-containing monomers are provided that comprise halo-substitution, particularly fluoro or chloro substation. Also preferred are resins provided by reaction of such monomer compounds.

Resins of Underlying Coating Compositions:

As discussed above, preferred resins include those that comprise one or more uracil moieties, including groups of the structure of Formula (I) above. Suitably, the one or more uracil moieties may be pendant to a resin backbone, or alternatively may be resin backbone linkages e.g. linked through each ring nitrogen or a uracil group.

Uracil resins of the invention may be synthesized by a variety of methods, e.g. though polymerization of one or more monomers that comprise uracil groups such as through an acidic or basic condensation reaction can be suitable. Particularly preferred uracil monomer and resin synthesis are set forth in the examples which follow. Preferably, at least about 1, 2, 3, 4 or 5 percent of the total repeat units of the formed resin comprise one or more uracil moieties, more preferably at least about 10, 15, 20, 25, 30, 35, 40, 45, 50 or 55 percent of the total repeat units of the formed resin.

Particularly preferred uracil resins of the invention comprises polyester linkages, i.e. polyester resins are preferred in certain aspects if the invention. Polyester resins can be readily prepared by reaction of one or more polyol reagents with one or more uracil-containing monomers. Suitable polyol reagents include diols, glycerols and triols such as e.g. diols such as diol is ethylene glycol, 1,2-propylene glycol, 1,3-propylene glycol, butane diol, pentane diol, cyclobutyl diol, cyclopentyl diol, cyclohexyl diol, dimethylolcyclohexane, and triols such as glycerol, trimethylolethane, trimethylolpropane and the like. Particularly preferred polyol reagents are set forth in the examples which follow.

Resins of coating compositions of the invention may comprise a variety of additional groups such as cyanurate groups, as disclosed in U.S. Pat. No. 6,852,421.

Particularly preferred resins of the invention may comprises one or more uracil groups, one or more cyanurate groups and polyester linkages.

As discussed, for antireflective applications, suitably one or more of the compounds reacted to form the resin comprise a moiety that can function as a chromophore to absorb radiation employed to expose an overcoated photoresist coating layer. For example, a phthalate compound (e.g. a phthalic acid or dialkyl phthalate (i.e. di-ester such as each ester having 1-6 carbon atoms, preferably a di-methyl or ethyl phthalate) may be polymerized with an aromatic or non-aromatic polyol and optionally other reactive compounds to provide a polyester particularly useful in an antireflective composition employed with a photoresist imaged at sub-200 nm wavelengths such as 193 nm Similarly, resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$alkyl naphthalenedicarboxylate. Reactive anthracene compounds also are preferred, e.g. an anthracene compound having one or more carboxy or ester groups, such as one or more methyl ester or ethyl ester groups.

The compound that contains a chromophore unit also may contain one or preferably two or more hydroxy groups and be reacted with a carboxyl-containing compound. For example, a phenyl compound or anthracene compound having one, two or more hydroxyl groups may be reacted with a carboxyl-containing compound.

Additionally, underlying coating composition that are employed for antireflective purposes may contain a material that contains chromophore units that is separate from a resin component that provides water contact angle modulation (e.g. a resin that contains photoacid-labile groups and/or base-reactive groups. For instance, the coating composition may comprise a polymeric or non-polymeric compound that contain phenyl, anthracene, naphthyl, etc. units. It is often preferred, however, that the one or more resins that provide water contact angle modulation also chromophore moieties.

Preferably resins of underlying coating compositions of the invention (including uracil-containing resins) will have a weight average molecular weight (Mw) of about 1,000 to about 10,000,000 daltons, more typically about 2,000 to about 100,000 daltons, and a number average molecular weight (Mn) of about 500 to about 1,000,000 daltons. Molecular weights (either Mw or Mn) of the polymers of the invention are suitably determined by gel permeation chromatography.

The uracil-containing component (e.g. uracil-containing) resin will be the major solids component of an underlying coating composition in many preferred embodiments. As referred to herein, solids of a coating composition refers to all materials of the coating composition except solvent carrier. In certain aspects, the uracil-containing component may be a minor portion (e.g. less than 50% of total solids) of a coating composition and be suitably blended with one or more other resins that do not contain uracil substitution.

As mentioned, preferred underlying coating compositions of the invention can be crosslinked, e.g. by thermal and/or radiation treatment. For example, preferred underlying coating compositions of the invention may contain a separate crosslinker component that can crosslink with one or more other components of the coating composition. Generally preferred crosslinking coating compositions comprise a separate crosslinker component. Particularly preferred coating compositions of the invention contain as separate components: a resin, a crosslinker, and an acid source such as a thermal acid generator compound. Thermal-induced crosslinking of the coating composition by activation of the thermal acid generator is generally preferred.

Suitable thermal acid generator compounds for use in a coating composition include ionic or substantially neutral thermal acid generators, e.g. an ammonium arenesulfonate salt, for catalyzing or promoting crosslinking during curing of an antireflective composition coating layer. Typically one or more thermal acid generators are present in an coating composition in a concentration from about 0.1 to 10 percent by weight of the total of the dry components of the composition (all components except solvent carrier), more preferably about 2 percent by weight of the total dry components.

Preferred crosslinking-type coating compositions of the invention also contain a crosslinker component. A variety of crosslinkers may be employed, including those crosslinkers disclosed in Shipley European Application 542008 incorporated herein by reference. For example, suitable coating composition crosslinkers include amine-based crosslinkers such as melamine materials, including melamine resins such as manufactured by Cytec Industries and sold under the tradename of Cymel 300, 301, 303, 350, 370, 380, 1116 and 1130. Glycolurils are particularly preferred including glycolurils available from Cytec Industries. Benzoquanamines and urea-based materials also will be suitable including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

A crosslinker component of a coating composition of the invention in general is present in an amount of between about 5 and 50 weight percent of total solids (all components except solvent carrier) of the antireflective composition, more typically in an amount of about 7 to 25 weight percent total solids.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604, or the surfactant FC 171 or FC 431 available from the 3M Company.

Underlying coating compositions of the invention also may contain other materials such as a photoacid generator, including a photoacid generator as discussed for use with an overcoated photoresist composition. See U.S. Pat. No. 6,261,743 for a discussion of such use of a photoacid generator in an antireflective composition.

To make a liquid coating composition of the invention, the components of the coating composition are dissolved in a suitable solvent such as, for example, one or more oxyisobutyric acid esters particularly methyl-2-hydroxyisobutyrate as discussed above, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an underlying coating composition varies from about 0.5 to 20 weight percent of the total weight of the coating composition, preferably the solids content varies from about 0.5 to 10 weight of the coating composition.

Exemplary Photoresist Systems

A variety of photoresist compositions can be employed with coating compositions of the invention, including positive-acting and negative-acting photoacid-generating compositions. Photoresists used with antireflective compositions of the invention typically comprise a resin binder and a photoactive component, typically a photoacid generator compound. Preferably the photoresist resin binder has functional groups that impart alkaline aqueous developability to the imaged resist composition.

As discussed above, particularly preferred photoresists for use with underlying coating compositions of the invention are chemically-amplified resists, particularly positive-acting chemically-amplified resist compositions, where the photoactivated acid in the resist layer induces a deprotection-type reaction of one or more composition components to thereby provide solubility differentials between exposed and unexposed regions of the resist coating layer. A number of chemically-amplified resist compositions have been described, e.g., in U.S. Pat. Nos. 4,968,581; 4,883,740; 4,810,613; 4,491,628 and 5,492,793. Coating compositions of the invention are particularly suitably used with positive chemically-amplified photoresists that have acetal groups that undergo deblocking in the presence of a photoacid. Such acetal-based resists have been described in e.g. U.S. Pat. Nos. 5,929,176 and 6,090,526.

Underlying coating compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Preferred positive-acting photoresists for use with an underlying coating composition of the invention contains an imaging-effective amount of photoacid generator compounds and one or more resins that are selected from the group of:

1) a phenolic resin that contains acid-labile groups that can provide a chemically amplified positive resist particularly suitable for imaging at 248 nm Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526.

2) a resin that is substantially or completely free of phenyl or other aromatic groups that can provide a chemically amplified positive resist particularly suitable for imaging at sub-200 nm wavelengths such as 193 nm Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462; iii) polymers that contain polymerized anhydride units, particularly polymerized maleic anhydride and/or itaconic anhydride units, such as disclosed in European Published Application EP01008913A1 and U.S. Pat. No. 6,048,662.

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhy- dride or itaconic anhydride. Such resins are disclosed in PCT/US01/14914 and U.S. application Ser. No. 09/567,634.

4) a resin that contains fluorine substitution (fluoropolymer), e.g. as may be provided by polymerization of tetrafluoroethylene, a fluorinated aromatic group such as fluorostyrene compound, and the like. Examples of such resins are disclosed e.g. in PCT/US99/21912.

Suitable photoacid generators to employ in a positive or negative acting photoresist overcoated over a coating composition of the invention include imidosulfonates such as compounds of the following formula:

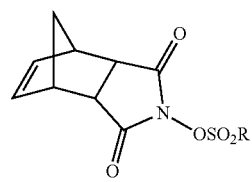

wherein R is camphor, adamantane, alkyl (e.g. $C_{1-12}$ alkyl) and fluoroalkyl such as fluoro ($C_{1-18}$alkyl) e.g. $RCF_2$— where R is optionally substituted adamantyl.

Also preferred is a triphenyl sulfonium PAG, complexed with anions such as the sulfonate anions mentioned above, particularly a perfluoroalkyl sulfonate such as perfluorobutane sulfonate.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

Other suitable photoacid generators for use in compositions of the invention include for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, nitrobenzyl derivatives, for example, 2-nitrobenzyl p-toluenesulfonate, 2,6-dinitrobenzyl p-toluenesulfonate, and 2,4-dinitrobenzyl p-toluenesulfonate; sulfonic acid esters, for example, 1,2,3-tris(methanesulfonyloxy)benzene, 1,2,3-tris (trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenensulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1, 3,5-triazine, and 2-(4-methoxynaphthyl)-4,6-bis(trichloromethyl)-1,3,5-triazine. One or more of such PAGs can be used.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a lactate salt of tetrabutylammonium hydroxide as well as various other amines such as triisopropanol, diazabicyclo undecene or diazabicyclononene. The added base is suitably used in relatively small amounts, e.g. about 0.03 to 5 percent by weight relative to the total solids.

Preferred negative-acting resist compositions for use with an overcoated coating composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by Cytec Industries under the trade names Cymel 300, 301 and 303. Glycoluril resins are sold by Cytec Industries under trade names Cymel 1170, 1171, 1172, Powderlink 1174, and benzoguanamine resins are sold under the trade names of Cymel 1123 and 1125.

Photoresists of the invention also may contain other optional materials. For example, other optional additives include anti-striation agents, plasticizers, speed enhancers, dissolution inhibitors, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

Lithographic Processing

In use, a coating composition of the invention is applied as a coating layer to a substrate by any of a variety of methods such as spin coating. The coating composition in general is applied on a substrate with a dried layer thickness of between about 0.02 and 0.5 µm, preferably a dried layer thickness of between about 0.04 and 0.20 µm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the underlying coating composition. Cure conditions will vary with the components of the underlying coating composition. Particularly the cure temperature will depend on the specific acid or acid (thermal) generator that is employed in the coating composition. Typical cure conditions are from about 80° C. to 225° C. for about 0.5 to 5 minutes. Cure conditions preferably render the coating composition coating layer substantially insoluble to the photoresist solvent as well as an alkaline aqueous developer solution.

After such curing, a photoresist is applied above the surface of the applied coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation through a mask in a conventional manner The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed resist coating layer is then developed, preferably with an aqueous based developer such as an alkali exemplified by tetra butyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100° C. to about 150° C. for several minutes to further cure the developed exposed coating layer areas.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the underlying coating layer.

A plasma etch conducted by the following protocol: a coated substrate (e.g., substrate coated with an underlying coating composition and resist in accordance with the invention) is placed in a plasma etch chamber (e.g., Mark II Oxide Etch Chamber) at 25 mT pressure, top power of 600 watts, 33 CHF) (Sccm), 7 O$_2$ (Sccm) and 80 Ar (Sccm).

The following non-limiting examples are illustrative of the invention. All documents mentioned herein are incorporated herein by reference.

EXAMPLE 1

Uracil Monomer Synthesis: Synthesis of 1,3 bis(t-butyl acetate)-5-Nitrouracil

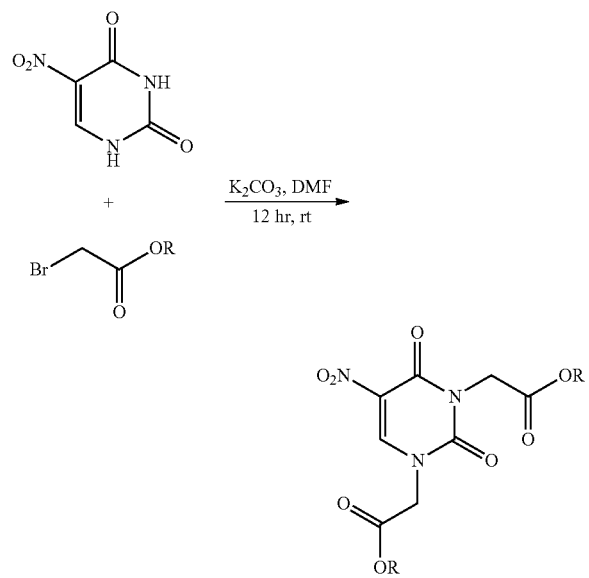

The title compound was synthesized as depicted in the above Scheme as follows. In a 500 mL three necked oven dried round bottom flask equipped with a magnetic stirrer, 25 g (0.159 mol) of 5-NitroUracil and 53.9 g (0.39 mol) of Potassium Carbonate ($K_2CO_3$) were suspended in 100 mL of Dimethylformadide (DMF) and the mixture stirred at room temperature for 1 hour, resulting in a thick gel. 77.3 g (0.39 mol) of t-Butyl bromoacetate dissolved in 50 mL of DMF was slowly added to the reaction mixture using a dropping funnel over a period of one hour and the reaction stirred for another 12 hr until completion was ascertained by TLC analysis (3:97 Methanol/Chloroform). The reaction was quenched by pouring the mixture slowly into 400 mL of 0.1% HCl solution, extracted into 300 mL of Ethyl Acetate, washed with water and brine to a neutral pH. The Ethyl acetate extracts were then dried over Sodium Sulphate, filtered and concentrated in the rotary evaporator affording 55 g or a yellowish oil. The oil was purified further by passing it through a silica gel plug eluting the desired product with chloroform. The solvent was evaporated to dryness and the clear oil recrystallized out of acetone and cold water affording 50 g of the pure product as a white solid in a 90% yield. $^1$H NMR 400 MHz ($CDCl_3$) δ 8.8 (s, 1H), 4.61 (s, 2H, $CH_2$), 4.58 (s, 2H, $CH_2$), 1.49 (s, 9H, $CH_3$), 1.46 (s, 9H, $CH_3$). $^{13}$C NMR 400 MHz ($CDCl_3$) δ 165.6, 165.2, 153.7, 149.2, 149.8, 84.4, 83.0, 51.4, 43.4, 27.93, 27.92.

EXAMPLE 2

Uracil Monomer Synthesis: Synthesis of 1,3 bis(t-butyl acetate)-5-Fluorouracil

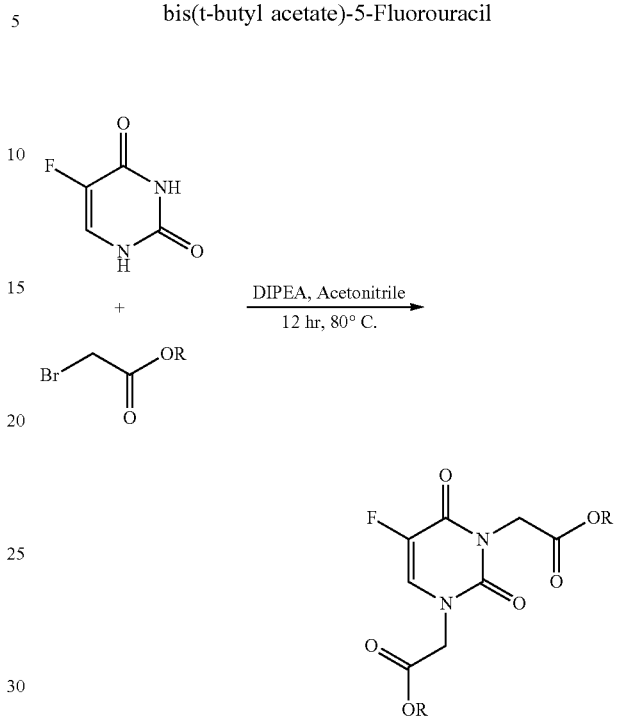

The title compound was synthesized as depicted in the above Scheme as follows. To a suspension of 5-Fluorouracil (40 g, 0.31 mol) in DMF (300 mL), was added t-Butyl bromoacetate (131.66 mL, 0.67 mol) and diisopropylethylamine (87.3 mL, 0.13 mol) at room temperature, the resultant mixture placed in a silicon oil bath and refluxed at 80° C. for 12 hours. Initially, the reaction mixture formed a suspension, but as the reaction progressed all the reactants went into solution. Upon completion ascertained by TLC analysis (Methanol/Chloroform ~3/97), the reaction was preconcentrated to smaller volume and later quenched by pouring into dilute acid (0.1% HCl, 400 mL) and extracted into ethyl acetate (350 mL), washed once with distilled water (400 mL) and dried over sodium sulfate and solvent evaporated under vacuum affording in quantitative yields a yellowish oil product. This oil was purified further by passing through a silica plug eluting with chloroform, Rota evaporated to dryness and recrystallized out of ethyl acetate and hexanes, affording 100 g of white crystals in 91% yields. $^1$H NMR 400 MHz ($CDCl_3$) δ 7.4 (s, 1H), 6.74 (d, J=4.4 Hz, 1H), 4.67 (s, 2H, $CH_2$), 4.23 (s, 2H, $CH_2$), 1.46 (s, 18H, $CH_3$). $^{13}$C NMR 400 MHz ($CDCl_3$) δ 166.9, 166.7, 152.7, 152.4, 149.8, 139.4, 137.6, 120.4, 120.1, 82.3, 81.7, 50.0, 43.8, 28.2

EXAMPLE 3

Uracil Polymer Synthesis

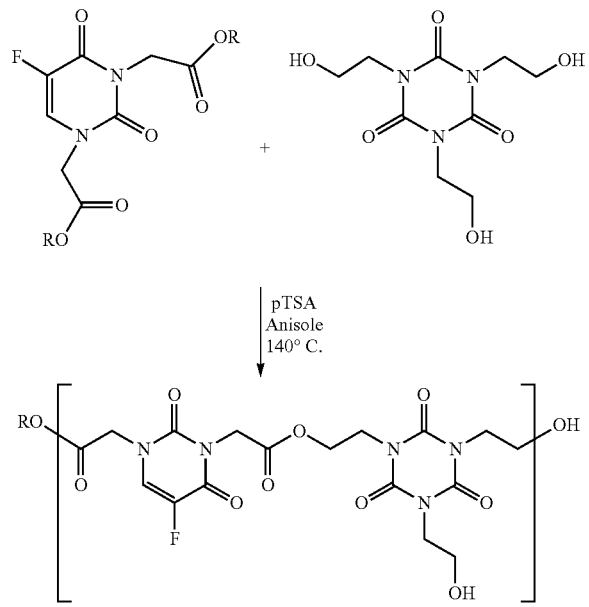

The polyester uracil polymer as depicted in the above Scheme was prepared as follows. 1,3 bis(t-butyl acetate)-5-Fluorouracil, 1,3,5-Tris(2-Hydroxyethyl)cyanuric acid, p-toluenesulfonic acid and anisole (50% solids) were charged into a 100 mL three necked oven dried round bottom flask equipped with a overhead stirrer, dean stark trap, heating mantle, temperature control box, temperature probe and condenser. The reactants were heated at 140° C. until the theoretical amount of distillate required was collected. The resultant polymer was allowed to cool and diluted to 25% solids using tetrahydrofuran and precipitated out of methyl tertbutyl ether/isopropanol (80/20) mixture. The obtained product was filtered and washed with copious amounts of precipitating solvent and afforded the desired polymer in 50% yields. Molecular weight was obtained using Gel permeation chromatography with polystyrene standards.

EXAMPLE 4

Uracil Polymer Synthesis

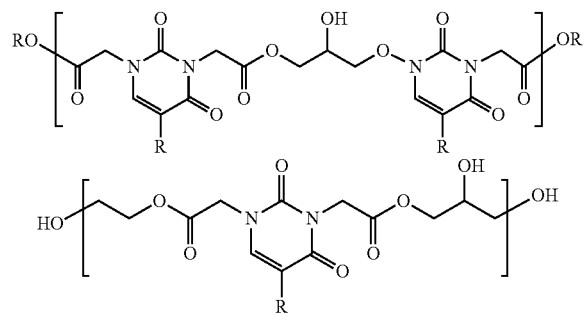

By procedures corresponding to those of Example 3 above, the above depicted polymers containing uracil moieties and polyester linkages can be prepared. R can be suitably a variety of hydrogen and non-hydrogen substituents as specified above for Formula I including e.g. halogen such as fluoro, bromo or chloro, optionally substituted C1-10alkyl, optionally substituted C1-10alkoxy and nitro.

EXAMPLE 5

Di and Tri-Functional Alcohols

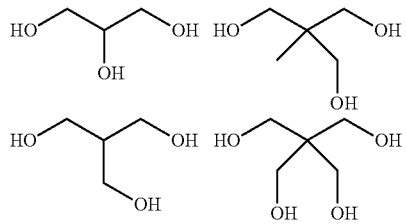

The above depicted polyols are useful for polymer (including polyester) syntheses.

EXAMPLE 6

Antireflective Composition Preparation

An anti-reflective casting solution comprising of 3.237 g of polymer from Example 3, 5.768 g of tetramethoxymethyl glycoluril, 0.371 g solution of ammoniated para-toluene sulfonic acid and 490.624 g of methyl-2-hydroxyisobutyrate are admixed and filtered through a 0.2μ Teflon filter.

EXAMPLE 7

Lithographic Processing

This formulated uracil resin-containing coating composition is spin coated onto a silicon microchip wafer and is cured at 210° C. for 60 seconds on a vacuum hotplate to provide a hardened coating layer.

A commercially available 193 nm positive-acting photoresist is then spin-coated over the cured coating composition layer. The applied resist layer is soft-baked at 100° C. for 60 seconds on a vacuum hotplate, exposed to patterned 193 nm radiation through a photomask, post-exposure baked at 110° C. for 60 seconds and then developed with 0.26 N aqueous alkaline developer where both the photoresist later and underlying coating composition are removed in areas defined by the photomask.

What is claimed is:
1. A coated substrate comprising:
   (a) a layer of a coating composition on a substrate, the coating composition comprising a polyester resin that comprises one or more uracil moieties,
   wherein the composition coating layer further comprises phenyl or anthacene groups, or where the uracil moieties are halogen-substituted; and
   (b) a photoresist layer over the coating composition layer.
2. The substrate of claim 1 wherein the resin further comprises one or more cyanurate groups.
3. The substrate of claim 1 wherein the coating composition further comprises phenyl or anthracene groups.

4. A method of forming a photoresist relief image, comprising:
(a) applying a coating composition on a substrate, the coating composition comprising a polyester resin that comprises one or more uracil moieties,
wherein the coating composition further comprises phenyl or anthacene groups, or where the uracil moieties are halogen-substituted;
(b) applying a photoresist composition above the coating composition layer; and
(c) exposing and developing the photoresist layer to provide a resist relief image.

5. The method of claim 4 wherein the coating composition further comprises a component that comprises phenyl or anthracene groups.

6. The method of claim 4 wherein the photoresist is exposed with 193 nm radiation.

7. The method of claim 4 wherein the applied coating composition is crosslinked prior to applying the photoresist composition.

8. An antireflective composition for use with an overcoated photoresist composition, the antireflective composition comprising a polyester resin that comprises one or more uracil moieties,
wherein the antireflective composition further comprises phenyl or anthacene groups, or where the uracil moieties are halogen-substituted.

9. The antireflective composition of claim 8 wherein the resin comprises phenyl groups.

10. The antireflective composition of claim 8 wherein the composition further comprises a crosslinker component.

11. The substrate of claim 1 wherein the uracil moieties correspond to the following Formula (I):

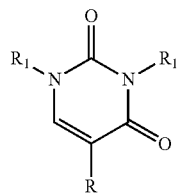

(I)

wherein R is a hydrogen or non-hydrogen substituent; and
each R1 is the same or different any may be hydrogen, a chemical bond or a non-hydrogen substituent.

12. The method of claim 4 wherein the uracil moieties correspond to the following Formula (I):

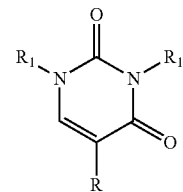

(I)

wherein R is a hydrogen or non-hydrogen substituent; and
each R1 is the same or different any may be hydrogen, a chemical bond or a non-hydrogen substituent.

13. The composition of claim 8 wherein the uracil linkages correspond to the following Formula (I):

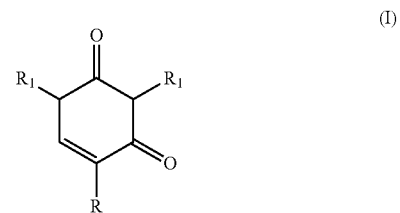

(I)

wherein R is a hydrogen or non-hydrogen substituent; and
each R1 is the same or different any may be hydrogen, a chemical bond or a non-hydrogen substituent.

14. The substrate of claim 1 wherein the uracil moieties are fluoro-substituted.

15. The method of claim 4 wherein the uracil moieties are fluoro-substituted.

16. The composition of claim 8 wherein the uracil moieties are fluoro-substituted.

17. The substrate of claim 11 wherein R is fluoro or nitro.

18. The method of claim 12 wherein R is fluoro or nitro.

19. The composition of claim 13 wherein R is fluoro or nitro.

20. The substrate of claim 1 wherein the uracil moieties are halogen-substituted.

21. The method of claim 4 wherein the uracil moieties are halogen-substituted.

22. The composition of claim 8 wherein the uracil moieties are halogen-substituted.

* * * * *